United States Patent [19]

Yamashita et al.

[11] Patent Number: 5,779,928
[45] Date of Patent: Jul. 14, 1998

[54] FILM DISSOLUTION METHOD OF DISSOLVING SILICA-BASED COATING FILM FORMED ON SURFACE OF A SUBSTRATE

[75] Inventors: Tetsuro Yamashita; Tsuyoshi Mitsuhashi; Manabu Yabe, all of Kyoto, Japan

[73] Assignee: Dainippon Screen Mfg. Co. Ltd., Japan

[21] Appl. No.: 799,478

[22] Filed: Feb. 12, 1997

[30] Foreign Application Priority Data

Feb. 13, 1996 [JP] Japan ................. 8-052475

[51] Int. Cl.⁶ ................. B44C 1/22; B08B 6/00
[52] U.S. Cl. ................. 216/92; 216/97; 216/99; 134/1.3
[58] Field of Search ................. 216/92, 97, 99; 134/1.3

[56] References Cited

U.S. PATENT DOCUMENTS

| | | |
|---|---|---|
| 4,011,351 | 3/1977 | Gipstein et al. ................. 427/43 |
| 5,328,871 | 7/1994 | Tanigawa et al. ................. 437/231 |

FOREIGN PATENT DOCUMENTS

| | | |
|---|---|---|
| 2-030132 | 1/1990 | Japan. |
| 4-171820 | 6/1992 | Japan. |
| 8-097205 | 4/1996 | Japan. |
| 8-264412 | 10/1996 | Japan. |

OTHER PUBLICATIONS

"Corrosion of Silica Glass by Aqueous Solutions of Organic Compounds"; Rybarikova et al.; abstract only; Ceram.–Silik (1996), 40(3).

*Primary Examiner*—Robert Kunemund
*Assistant Examiner*—George Goudreau
*Attorney, Agent, or Firm*—Ostrolenk, Faber, Gerb & Soffen, LLP

[57] ABSTRACT

A film dissolving liquid is ejected from a needle-shaped nozzle onto a peripheral edge portion of a substrate surface of a SOG film, while being subjected to the film dissolving liquid. The substrate is rotated in order to dissolve and remove the SOG film from the peripheral edge portion of the substrate. The film dissolving liquid is a solvent or mixture of two or more solvents selected from the group cyclohexanone, γ-butyrolactone, ethyl lactate or ethyl pyruvate. As a result, a swelling of the SOG film is not created at the edge portion of the substrate. A crack is not therefore created at the edge portion of the SOG film, and generation of particles due to a damage at the film swelling portion thereof is prevented.

4 Claims, 2 Drawing Sheets

FILM DISSOLUTION METHOD OF DISSOLVING SILICA-BASED COATING FILM FORMED ON SURFACE OF A SUBSTRATE

BACKGROUND OF THE INVENTION

1. Field of the Invention

The present invention relates to a film dissolution method for dissolving a silica-based coating film (e.g., spin on glass film, or SOG film) on a surface of a substrate, such as a semiconductor wafer and a glass substrate for a liquid crystal display (LCD) device or a photomask, prior to heating. The substrate is held horizontally an a is rotated around a vertical axis while a chemical is ejected toward a peripheral edge portion of the substrate from a needle-shaped nozzle so as to dissolve and remove the unwanted SOG film at the peripheral edge portion of the substrate.

2. Description of the Prior Art

In manufacturing steps for manufacturing a semiconductor, after forming an SOG film on a surface of a substrate, while processed through various types of subsequent processing steps, the substrate is inserted into a cassette, removed from a cassette or held by a transportation mechanism. When the substrate is inserted, removed or held during the processing steps, the peripheral edge of the substrate contacts a containing groove which is formed in the cassette or chuck portion of the transportation mechanism. As a result, the SOG film at the peripheral edge portion is peeled off and results in particle generation, as it is known in the art. As a conventional countermeasure to deal with this, during the step of forming the SOG film, after spin-coating a surface of the substrate with the SOG film, the SOG film at the peripheral edge portion of the substrate is dissolved and removed. For such processing, an apparatus as that disclosed in Japanese Patent Publication Laid-Open No.4-111729 is used.

The disclosed spin coating apparatus, as shown in the perspective view of FIG. 1, includes a chuck 10 which by application of a suction force horizontally holds a substrate W. The substrate is rotated by a motor (not shown) around a vertical axis with a rotation shaft 12 vertically and integrally disposed. Although not shown in FIG. 1, the disclosed spin coating apparatus also includes a nozzle which supplies an SOG material onto the substrate W which is held by the chuck 10. A cup which is disposed to surround the substrate W is held by the chuck 10 so as to collect excessive amounts of the SOG material spatters from the peripheral edge of the substrate W, etc. The SOG material is dropped down from the nozzle onto a central portion of the substrate W and is spread all over the substrate W as a thin film, so that an SOG film is formed on the surface of the substrate W.

Further, on the side of the cup, a film removal mechanism 14 is disposed which dissolves and removes the SOG film from a peripheral edge portion of the substrate W. In the mechanism 14, a needle-shaped nozzle 16 despenses and supplies a film dissolving liquid to the substrate W. A nozzle supporting arm 18 seats the needle-shaped nozzle 16 at the tip thereof. A rotation shaft 20 is held upright with a top end portion fixed to an edge portion of the arm 18. A movable frame 22 supports the rotation shaft 20 rotatably around a vertical axis. An air cylinder 24 is fixed to an apparatus frame not shown and has a piston rod with a tip portion thereof fixed to the movable frame 22 so as to move the movable frame 22 in a vertical direction. A pair of guide rollers 26, 26 are attached to the nozzle supporting arm 18. A guide rail 28 is fixed upright to the apparatus frame not shown with an upper portion bent in a direction away from the substrate W which is held by the chuck 10, and is fitted with the guide rollers 26, 26 which hold the guide rail 28 from both sides.

The film removal mechanism 14 having such a structure as described above operates as follows. When the movable frame 22 is located at an elevated position as shown by the solid line as the air cylinder 24 is driven to extend, the nozzle supporting arm 18 turns away at a large distance from the substrate W as shown by the solid line, whereby the needle-shaped nozzle 16 is held at an upper stand-by position. On the other hand, when movable frame 22 moves downward as the air cylinder 24 is driven to shrink, in accordance with that the arm 18, guided by the guide rail 28, turns to come close to the substrate W. As indicated by the two-dot-line, the needle-shaped nozzle 16 is consequently located at the lowest position so that the tip portion of the needle-shaped nozzle 16 faces the peripheral edge portion of the substrate W with a predetermined gap, e.g., 1 mm. After that, the film dissolving liquid is ejected from the needle-shaped nozzle 16 onto the peripheral edge portion of the substrate W, which is rotating, so that the unwanted SOG film is dissolved at and removed from the entire peripheral edge portion of the substrate W.

As the film dissolving liquid which is ejected from the needle-shaped nozzle 16 dissolves and removes the SOG film from the peripheral edge portion of the substrate W, isopropyl alcohol (IPA) and butyl acetate are conventionally used.

However, when IPA and butyl acetate are used as the film dissolving liquid, a film swelling portion C is created at an end portion of the SOG film, as shown in FIG. 3. FIG. 3 shows a change in film thickness at a boundary portion between a covered portion A covered with the SOG film and a removed portion B where the SOG film is dissolved and removed from the peripheral edge portion of the substrate W. In FIG. 3, the symbol S denotes the position of the surface of the substrate. For dissolution, IPA was used as the film dissolving liquid, the processing time was 0.5 seconds, the rotation speed of the substrate was 1,700 rpm, the diameter of the needle-shaped nozzle was 0.49 mm, and the flow rate of IPA injected from the needle-shaped nozzle was 25 cc/min. To form the SOG film on the surface of the substrate, HSG-2209 which is available from Hitachi Chemical Co., Ltd. was used. When there is the film swelling portion C created at an end portion of the SOG film, the film swelling portion C easily cracks. The swelling film portion C is damaged at a crack, and thereby generates particles.

SUMMARY OF THE INVENTION

The present invention is directed to a film dissolution method of dissolving a silica-based coating film formed on a surface of a substrate, comprising steps of (a) preparing a needle-shaped nozzole, (b) preparing a substrate on a surface of which a silica-based coating film is formed, (c) obtaining, as film dissolving liquid, a solvent or a mixture of two or more solvents selected from a group which consists of, γ-butyrolactone, ethyl lactate and ethyl pyruvate, (d) holding the substrate horizontally, (e) rotating the substrate around a vertical axis, and (f) injecting the film dissolving liquid from the needle-shaped nozzle onto a peripheral edge portion of the substrate so that an unwanted coating film is dissolved at and removed from the peripheral edge portion of the substrate.

In the film dissolution method according to the present invention, since cyclohexanone, γ-butyl lactone, ethyl lactate, ethyl pyruvate, or a mixture of two or more thereof is used as the film dissolving liquid in order to dissolve and remove an unwanted portion of the SOG film, which is formed on a surface of the substrate, from the peripheral edge portion of the substrate, a swelling at an end portion of the SOG film is not created or is suppressed small. This prevents a crack at the end portion of the SOG film, and hence, generation of particles due to a damage at the swelling portion of the SOG film.

Accordingly, an object of the present invention is to provide a film dissolution method, whereby during dissolution and removal of an unwanted portion of an SOG film, which is created on a surface of a substrate, from a peripheral edge portion of the substrate, a swelling is not created or is suppressed at an end portion of the SOG film so that a crack is not created at the end portion of the SOG film and generation of particles due to a damage at a swelling portion of the SOG film is prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
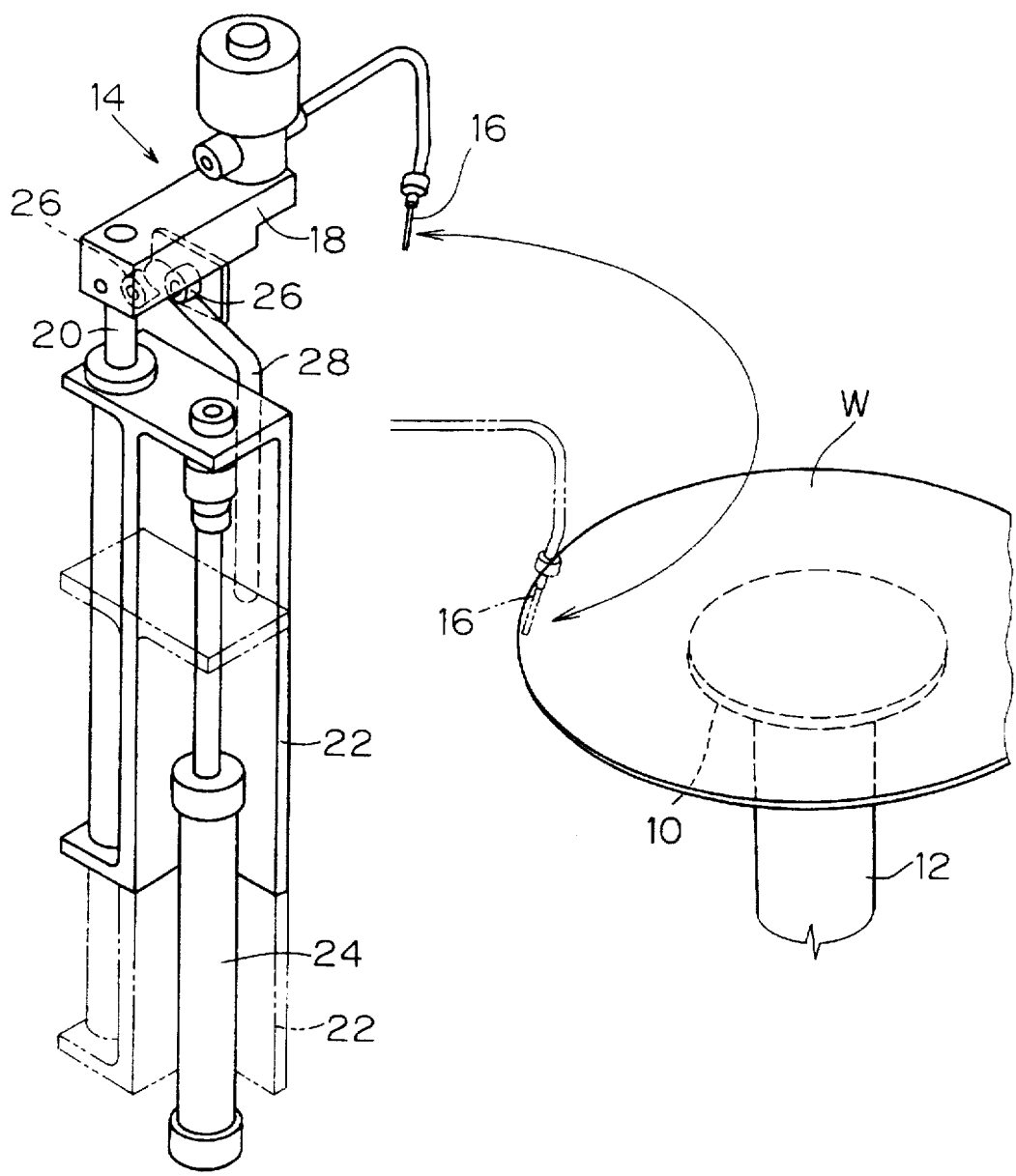
FIG. 1 is a perspective view showing an example of a structure of a spin coating apparatus which includes a film removal mechanism.

In the present invention, either one of cyclohexanone, γ-butyrolactone, ethyl lactate and ethyl pyruvate is used as a film dissolving liquid to dissolve an SOG film. Alternatively, mixture of two or more types of these solvents is used as the film dissolving liquid. Using a spin coating apparatus which includes a film removal mechanism such as the mechanism 14 shown in FIG. 1, the film dissolving liquid, such as cyclohexane, is ejected from a needle-shaped nozzle 16 onto a peripheral edge portion of a substrate W which, with a SOG film formed on a surface thereof, is held and rotated by a chuck 10. Accordingly, an unwanted portion of the SOG film is dissolved at and removed from the entire peripheral edge portion of the substrate W by the film dissolving liquid.

Figure 2:
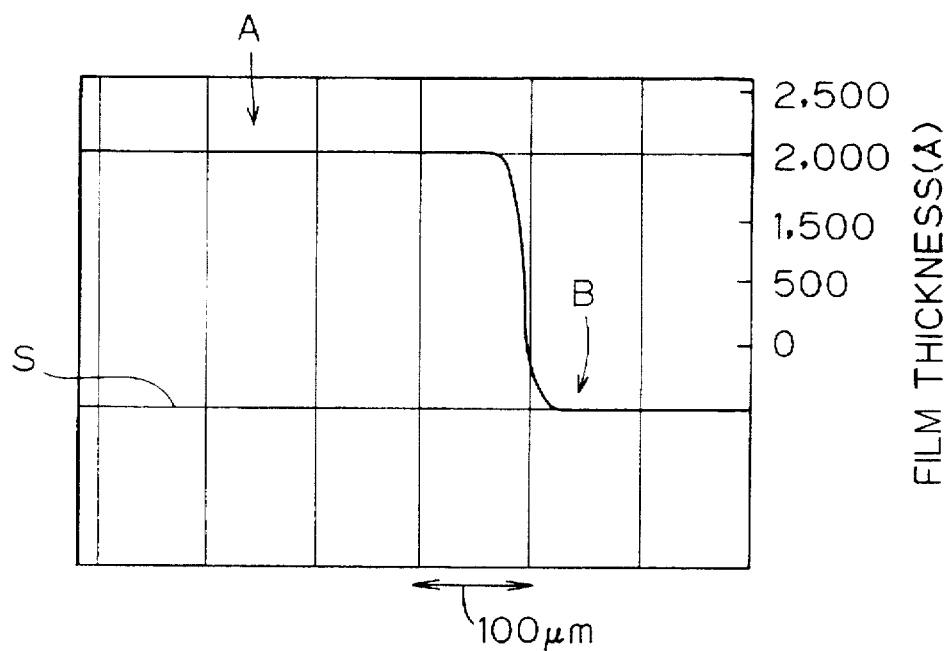
FIG. 2 is a graph showing a change in film thickness at a boundary portion between a covered portion A covered with an SOG film and a removed portion B where the SOG film is dissolved at and removed from a peripheral edge portion of a substrate using cyclohexanone, i.e., one of the film dissolving liquids which are used in a method according to the present invention.
Figure 3:
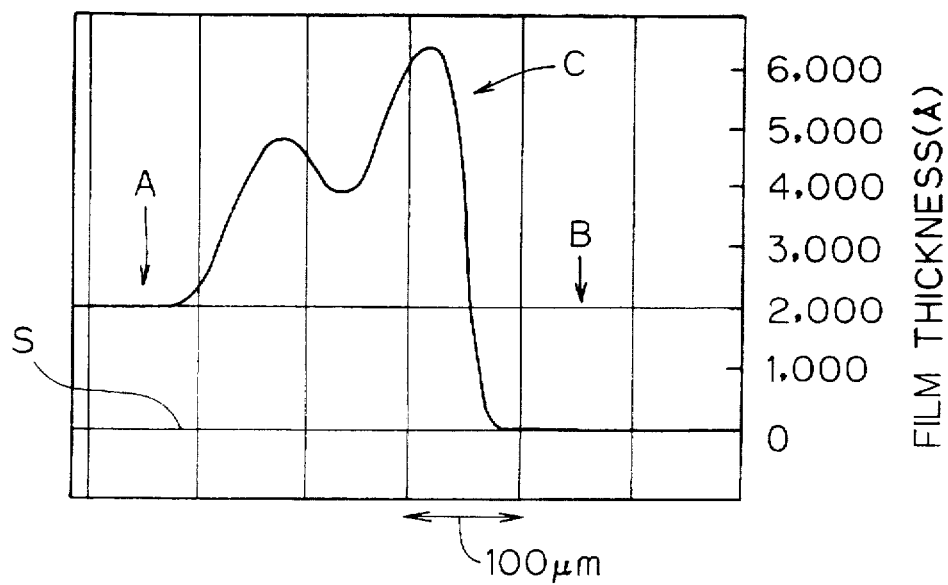
FIG. 3 is a graph showing a change in film thickness at a boundary portion between the covered portion A covered with the SOG film and the removed portion B where the SOG film is dissolved at and removed from a peripheral edge portion of a substrate using IPA, i.e., the film dissolving liquids which are conventionally used.

FIG. 2 shows a change in film thickness at a boundary portion between a covered portion A that is covered with an SOG film and a removed portion B where the SOG film is dissolved at and removed from the peripheral edge portion of the substrate using cyclohexanone as the film dissolving liquid. The processing time was 0.5 seconds, the rotation speed of the substrate was 1,700 rpm, the diameter of the needle-shaped nozzle was 0.49 mm, and the flow rate of cyclohexanone ejected from the needle-like nozzle was 15 cc/min. The SOG film on the surface of the substrate was formed using HSG-2209 (brand name) which is available from Hitachi Chemical Co., Ltd. As shown in FIG. 2, a film swelling portion C as that shown in FIG. 3 is not created at an end portion of the SOG film.

The SOG material was changed among various types to form an SOG film on a surface of each substrate. For the respective SOG films, cyclohexanone, γ-butyrolactone, ethyl lactate and ethyl pyruvate were use as the film dissolving liquid so that the SOG films were dissolved at and removed from a peripheral edge portion of each substrate. Table 1 shows the results. The conditions for processing were the same as described above. Commercially available chemicals A to G which were used as the SOG material are as follows: chemical A was TYPE7 (brand name) available from Tokyo Ohka Kogyo Co., Ltd.; chemical B was SF-1014 (brand name) available from Sumitomo Chemical Co., Ltd.; chemical C was to HSG-2209 (brand name) available from Hitachi Chemical Co., Ltd.; chemical D was Accuglass (brand name) available from Allied Signal Inc.; chemical E was TYPE2 (brand name) available from Tokyo Ohka Kogyo Co., Ltd.; chemical F was FOX-15 (brand name) available from Dow Corning Toray Silicone Co., Ltd.; and chemical G was Ceramate CIP (brand name) available from Catalysts & Chemicals Industries Co., Ltd. Of these chemicals, chemicals A to D are organic SOG materials while chemicals E to G are inorganic SOG materials.

TABLE 1

| Chemicals | IPA | | Cyclohexanone | | γ-Butyrolactone | | Ethyl lactate | | Ethyl pyruvate | |
|---|---|---|---|---|---|---|---|---|---|---|
| | Appearance | Swelling | Appearance | Swelling | Appearance | Swelling | Appearance | Swelling | Appearance | Swelling |
| Chemical A | excellent | ≧10,000 (Å) | excellent | none | excellent | none | excellent | ≧1,500 (Å) | excellent | none |
| Chemical B | excellent | ≧10,000 (Å) | excellent | none | excellent | none | excellent | none | excellent | none |
| Chemical C | some remained | none | excellent | none | excellent | none | excellent | none | excellent | none |
| Chemical D | excellent | ≧2,500 (Å) | excellent | ≧1,000 (Å) | excellent | none | excellent | ≧2,500 (Å) | excellent | ≧500 (Å) |
| Chemical E | excellent | ≧10,000 (Å) | excellent | ≧3,000 (Å) | excellent | none | excellent | ≧2,500 (Å) | excellent | ≧3,000 (Å) |
| Chemical F | unusable | | excellent | none | unusable | | unusable | | unusable | |
| Chemical G | unusable | | excellent | none | — | | — | | — | |

In Table 1, descriptions such as "≧10,000 Å", "≧1,500 Å", and so on represent that the film swelling cannot be 10,000 Å or smaller, 1,500 Å or smaller, and so on, respectively. As clearly understood from the results which are shown in Table 1, cyclohexanone, γ-butyrolactone, ethyl lactate and ethyl pyruvate are each sufficiently competent as a film dissolving liquid and superior in ability to IPA.

While the invention has been described in detail, the foregoing description is in all aspects is illustrative and not restrictive. It is understood that numerous other modifications and variations can be devised without departing from the scope of the invention.

We claim:

1. A film dissolution method of dissolving a silica-based coating film formed on a surface of a substrate; comprising the steps of:

(a) preparing a needle-shaped nozzle;

(b) preparing a substrate on a surface of which a silica-based coating film is formed;

(c) obtaining, as film dissolving liquid, a solvent or a mixture of two or more solvents selected from a group which consists of γ-butyrolactone, ethyl lactate and ethyl pyruvate;

(d) holding said substrate horizontally;

(e) rotating said substrate around a vertical axis; and (f) injecting said film dissolving liquid from said needle-shaped nozzle onto a peripheral edge portion of said substrate so that an unwanted coating film is dissolved at and removed from said peripheral edge portion of said substrate.

2. The film dissolution method of claim 1, wherein said silica-based coating film is an organic SOG material.

3. The film dissolution method of claim 2, wherein said step (c) comprises a step of obtaining, as said film dissolving liquid, a solvent of ethyl pyruvate.

4. The film dissolution method of claim 3, wherein said silica-based coating film is a material which can not suppress swelling to less than 10,000 Å at an end portion of said silica-based coating film after isopropyl alcohol as said film dissolving liquid is supplied onto said peripheral edge portion.

* * * * *